United States Patent [19]

Okabayashi

[11] Patent Number: 5,210,713

[45] Date of Patent: May 11, 1993

[54] DATA STORAGE METHOD AND FIRST-IN FIRST-OUT MEMORY DEVICE

[75] Inventor: Ichiro Okabayashi, Takatsuki, Japan

[73] Assignee: Matsushita Electric Industrial Co., Ltd., Osaka, Japan

[21] Appl. No.: 752,788

[22] Filed: Aug. 30, 1991

[30] Foreign Application Priority Data

Sep. 3, 1990 [JP] Japan ................................. 2-233539

[51] Int. Cl.$^5$ ........................ G11C 13/00; G11C 15/00
[52] U.S. Cl. ................................. 365/49; 365/189.05; 365/189.07; 365/221
[58] Field of Search ............ 365/49, 221, 233, 189.01, 365/189.05, 189.07, 189.08, 230.01, 230.08

[56] References Cited

U.S. PATENT DOCUMENTS 4,982,379 1/1991 Miyata ............................ 365/230.08

Primary Examiner—Terrell W. Fears
Attorney, Agent, or Firm—Wenderoth, Lind & Ponack

[57] ABSTRACT

A first-in first-out memory device for storing a series of numeral signals includes a comparator for comparing each input numeral signal with a preselected numeral signal, and for producing a matching signal when the input numeral signal is the same as the preselected numeral signal, and an unmatching signal when the input numeral signal is not the same as the preselected numeral signal. An up-counter counts the number of repetition of the matching signal. When the input numeral signal is other than the preselected numeral signal, a tag signal representing the numeral signal is produced and, at the same time, a data signal representing the value of the numeral signal is produced. When the input numeral signal is the preselected numeral signal, such as zero, a tag signal representing repetition number signal is produced and, at the same time, the data signal representing the number of repetition of zeros is produced. Such a pair of tag signal and data signal is stored in a memory.

10 Claims, 10 Drawing Sheets

STORED NUMERAL DATA 3 8 0 0 0 0 0 0 3 3 0 0 0 0 6

NUMBER OF REPETITION OF COMPRESSION NUMBER

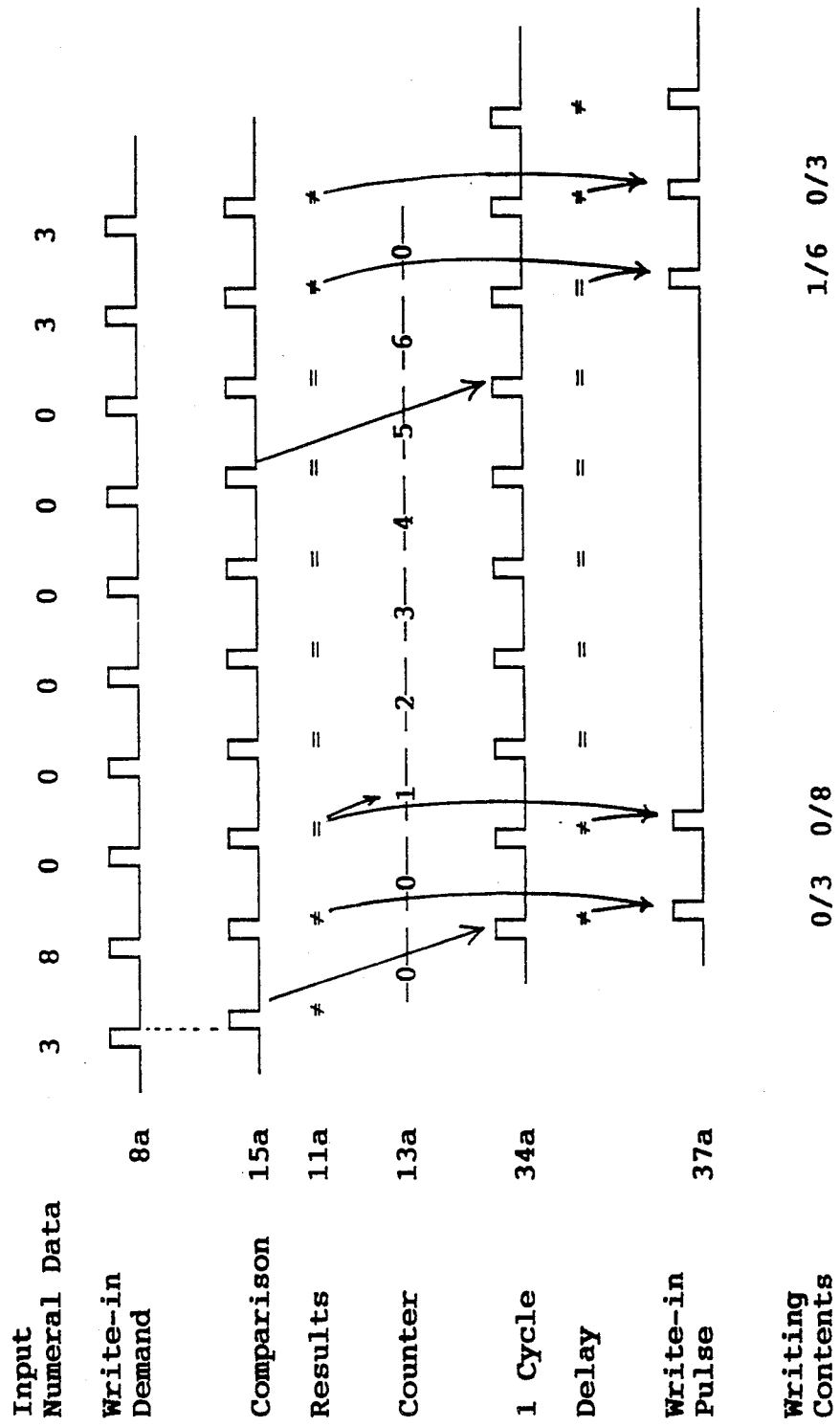

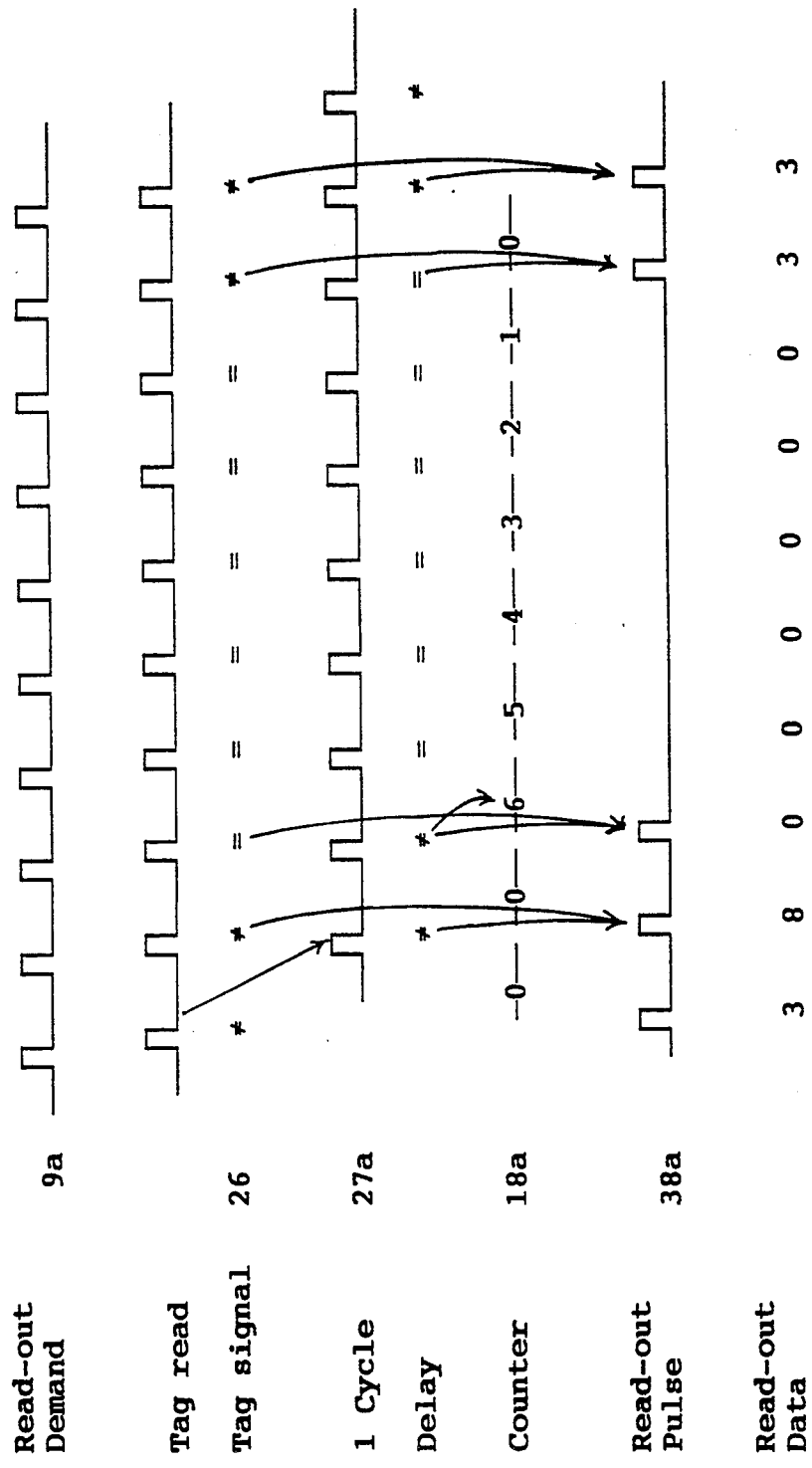

Fig. 5a

ENCODER INPUT

| 3 | 5 | 0 | 0 | 0 | 1 | 4 | 0 | 0 | 2 | 6 |
|---|---|---|---|---|---|---|---|---|---|---|

ENCODER OUTPUT

| 0/3 | 0/5 | 1/3 | 0/1 | 0/4 | 1/2 | 0/2 | 0/2 | 0/6 |
|-----|-----|-----|-----|-----|-----|-----|-----|-----|

Fig. 5b

DECODER INPUT

| 0/3 | 0/5 | 1/3 | 0/1 | 0/4 | 1/2 | 0/2 | 0/2 | 0/6 |
|-----|-----|-----|-----|-----|-----|-----|-----|-----|

DECODER OUTPUT

| 3 | 5 | 0 | 0 | 0 | 1 | 4 | 0 | 0 | 2 | 6 |
|---|---|---|---|---|---|---|---|---|---|---|

DATA STORAGE METHOD AND FIRST-IN FIRST-OUT MEMORY DEVICE

BACKGROUND OF THE INVENTION

1. Field of the Invention

The present invention relates to a method for storing the data necessary for the numerical calculation of the computer, and more particularly, to a first-in first-out memory device used, for example, in a computer for the data storage and data transfer, particularly in a parallel processing system.

2. Description of the Prior Art

The data storage method according to the prior art is described, for example, in "Numerical Calculation Programming" pages 98-101 (Author: Masatake Mori, Publisher: Iwanami Shoten).

FIG. 7a shows a prior art first-in first-out memory method for storing numeral signals. A memory area 101 is provided with a portion 102 for storing the data representing the position of the numeral signal and a portion 103 for storing the data representing the value of the numeral signal. The numeral signal which occurs with a high frequency, such as zero, is disregarded so as to compress the storing area. For example, when the numeral signals to be stored are 3, 8, 0, 0, 0, 0, 0, 0, 3, 3, 0, 0, 0, 0, 6, numeral signal positions 1, 2, 9, 10, 15 excluding those of zeros are stored sequentially in portion 102, while the values 3, 8, 3, 3, 6 of the numeral signals at the corresponding positions are stored sequentially in portion 103.

FIG. 7b shows a first-in first-out memory device according to the prior art. In response to the write-in instruction, a write control 115 outputs a write-in pulse so as to store the position data and numeral signal from input 110 to an address in memory area 136 as pointed by a write pointer 137. Then, in response to the read-out instruction, a reading control 116 outputs a read-out pulse so as to read the position data and numeral signal from an address pointed by a read pointer 138 from output 119.

The prior art data storage method as described above, however, has the following problems.

In the case where the number of occurrence of zeros is decreased, the data compression efficiency is decreased. In fact, the data size may be increased due to the increase of the position data.

Also, it is necessary to prepare two multi-bit data, one for the position data and the other for the numeral value data. This results in a extra processing time and processing steps. Thus, the hardware and/or the software will become complicated, and high cost.

Furthermore, it is not possible to compress two or more numeral signal.

SUMMARY OF THE INVENTION

The object of the present invention is therefore to provide an improved data storage method and a first-in first-out memory device which solves these problems.

In order to achieve the aforementioned object, a data storage method according to the present invention for storing a series of numeral signals comprises the steps of: storing a tag signal which discriminates between a numeral signal and a repetition number signal; and storing, correspondingly to the tag signal, a data signal which represents a value of a numeral signal other than a preselected numeral signal when the tag signal is representing the numeral signal, and represents a number of repetition of the preselected numeral signal when the tag signal is representing the repetition number signal.

Also, a first-in first-out memory device according to the present invention for storing a series of numeral signals comprises: a comparator means for comparing between each input numeral signal and a preselected numeral signal, and for producing a match signal when the input numeral signal is the same as the preselected numeral signal, and an unmatching signal when the input numeral signal is not the same as the preselected numeral signal; a first counter means for counting the number of repetition of the matching signal; and an encoding means for encoding the series of input numeral signals to a tag signal and a corresponding data signal such that: the tag signal discriminates between a numeral signal and a repetition number signal, and the data signal represents a value of a numeral signal other than the preselected numeral signal when the tag signal is representing the numeral signal, and represents a number of repetition of the preselected numeral signal when the tag signal is representing the repetition number signal.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 2b shows waveforms for carrying out the encoding process;

FIG. 2c shows waveforms for carrying out the decoding process;

FIG. 5a is a diagram showing the input and output data of the encoder type first-in first-out memory device shown in FIG. 3;

FIG. 5b is a diagram showing the input and output data of the decoder type first-in first-out memory device shown in FIG. 4;

DETAILED DESCRIPTION OF THE PREFERRED EMBODIMENTS

Figure 1A:
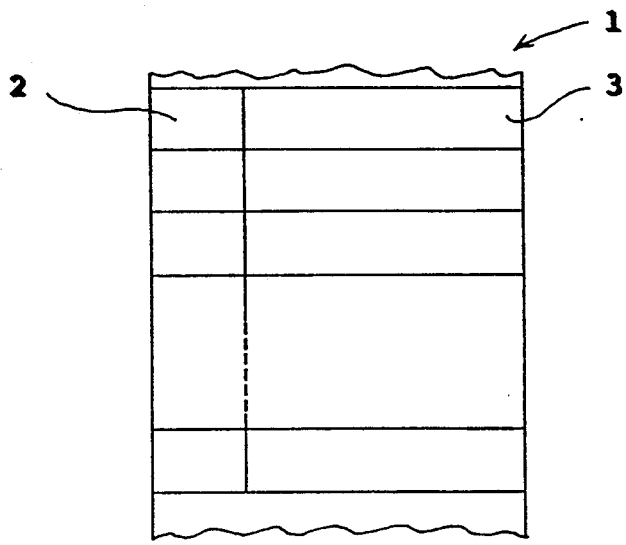
FIGS. 1a and 1b are diagrams showing data storage method according to the present invention.
Figure 1B:
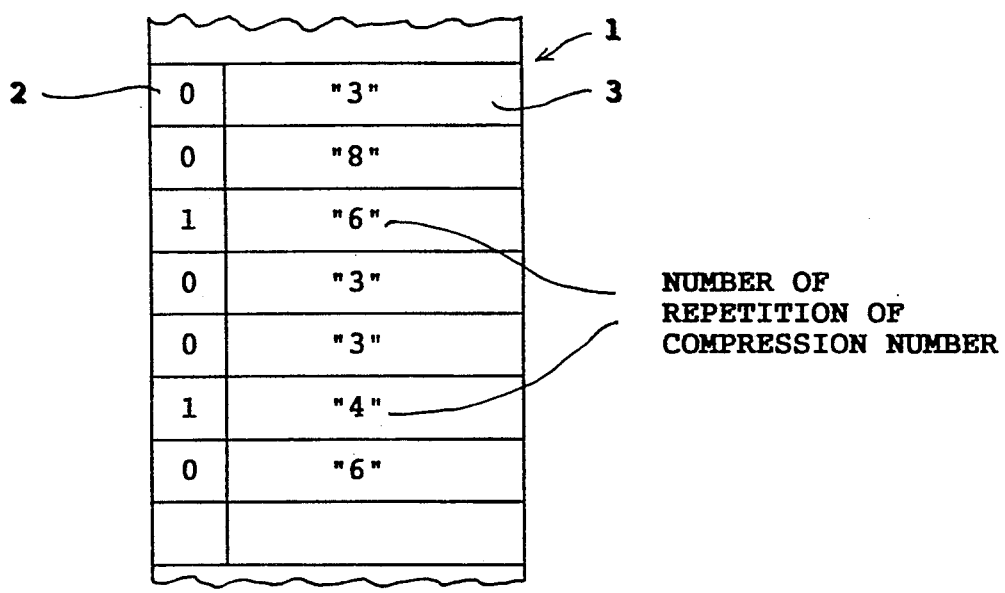

Referring to FIGS. 1a and 1b, diagrams of a memory is shown for explaining a compressed data storage method according to the present invention.

As shown in FIG. 1a, a memory area 1 includes a plurality of segments, each segment has a tag portion 2 for storing one bit data and a data portion 3 for storing a plurality of bits of data. When the tag portion 2 is stored with "0", it is so indicated that the data portion 3 stores a numeral signal other than the numeral signal for compression, and when the tag portion 2 is stored with "1", it is so indicated that the data portion 3 stores a number of repetition of the numeral signal to be compressed.

An example given hereinbelow is directed to a case for storing a series of numeral signal 3, 8, 0, 0, 0, 0, 0, 0, 3, 3, 0, 0, 0, 0, 6, provided that zero is the number to be compressed for storing.

As shown in FIG. 1b, in the first segment, "0" is stored in tag portion 2 indicating that the number stored in the corresponding data portion 3 is a numeral signal, which is the first occurring "3" in the above example. In the second segment, "0" is stored in tag portion 2 indicating that the number "8" is stored in the corresponding data portion 3. In the third segment, "1" is stored in tag portion 2 indicating that zeros are repeated, and the number of repetition is shown in the corresponding data portion 3, which is "6" according to the above given example. In this manner, any time the number to be compressed, i.e., zero, appears, "1" is stored in tag portion 2 and repetition number of the zeros is stored in data portion 3. When the data stored in each segment is expressed as:

tag portion signal/data portion signal, the above given example of series of numeral signal is stored as:

0/3, 0/8, 1/6, 0/3, 0/3, ¼, 0/6.

Thus, by the above compression method, only seven segments are used for storing fifteen numeral signal.

In the above example, only one compression number, which is zero, is selected, but it is possible to select plurality of compression numbers. In this case, the tag portion 2 must have a capacity to store two or more digits. In the case where the tag portion 2 has a two-bit capacity, it is possible to select three compression numbers. For example, when the tag portion 2 is stored with "00" it is so indicated that the number stored in the corresponding data portion 3 is a numeral signal; when the tag portion 2 is store with "01" it is so indicated that the number stored in the corresponding data portion 3 is a number of repetition of the first numeral signal to be compressed, e.g., zero; when the tag portion 2 is store with "10" it is so indicated that the number stored in the corresponding data portion 3 is a number of repetition of the second numeral signal to be compressed, e.g., three; and when the tag portion 2 is store with "11" it is so indicated that the number stored in the corresponding data portion 3 is a number of repetition of the third numeral signal to be compressed, e.g., six. When this rule is applied to the above given example of series of numbers, the data stored in the segments will be:

10/1, 00/8, 01/6, 10/2, ¼, 11/1.

Thus, by the above compression method, only six segments are used for storing fifteen numeral signals.

Figure 2A:
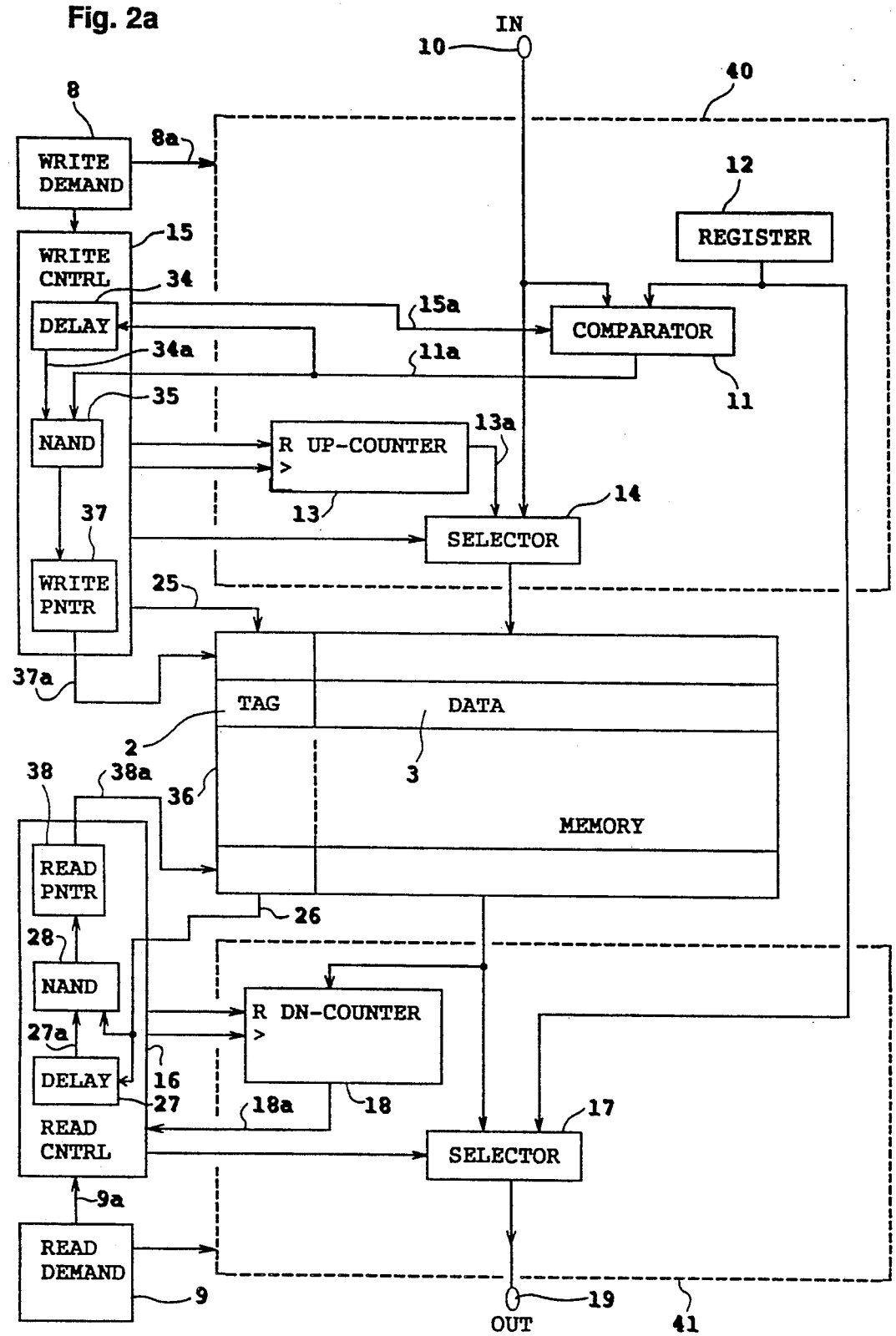
FIG. 2a is a block diagram of a first-in first-out memory device according to a first embodiment of the present invention.

Referring to FIG. 2a, a block diagram of a first-in first-out memory device according to the first embodiment of the present invention is shown.

The first-in first-out memory device of the first embodiment comprises an input compression section 40, a write-in demand unit 8, a write-in control 15, a memory 36, an output expansion section 41, a read-out demand unit 9, and a read-out control 16.

The input compression section 40 includes a register 12, a comparator 11, an up-counter 13 and an input selector 14. The output expansion section 41 includes an output selector 17 and a down-counter 18.

For the data compression, register 12 is previously stored with a compression number, such as zero. Upon input of the numeral signal from input terminal 10 as controlled by write-in demand unit 8, comparator 11 compares the input numeral signal with the compression number from register 12. When the input numeral signal is equal to the compression number, comparator 11 produces a matching signal, and when the input numeral signal is not equal to the compression number, comparator 11 produces an unmatching signal. Matching or unmatching signal is applied to write-in control 15.

When the unmatching signal is received, the write-in control 15 controls input selector 14 to select the numeral signal from input terminal 10 and, at the same time, a tag signal "0" is produced along line 25. Then, when a write pulse is produced from write pointer 27, the tag signal "0" is stored in tag portion 2 and, at the same time, the numeral signal from selector 14 is stored in data portion 3.

On the other hand, when the matching signal is received, the write-in control 15 enables the up-counter 13 to count up from zero to count up sequentially the received matching signals. Furthermore, the write-in control 15 controls input selector 14 to select the output data from up-counter 13. Then, when the unmatching signal is received for the first time after the series of matching signals, the up-counter 13 ends the counting and the counted result is outputted from selector 14. Then, when a next write pulse is produced from write pointer 27, the tag signal "1" is stored in tag portion 2 and, at the same time, the counted data signal from selector 14 is stored in data portion 3.

Next, a detailed operation of the input compression section 40 is described with reference to FIG. 2b.

In response to each write-in demand pulse transmitted along line 8a from write-in demand unit 8, a series of numeral signals are applied to comparator 11. A comparison pulse, which is slightly delayed with respect to the demand pulse, is transmitted along line 15a to comparator 11 to carry out the comparison between the numeral signal from input 10 and stored compression numeral. The comparison result signal which is either a matching signal (indicated by =) or unmatching signal (indicated by ≠) is transmitted along line 11a. The up-counter 13 is reset in response to each unmatching signal, and counts up in response to each matching signal. Since there are six matching signals in the example shown in FIG. 2b, counter 13 counts up to six.

Write control 15 has a delay 34 for delaying the comparison result signal by one cycle, and a NAND gate 35 for taking a NAND between the non-delayed and delayed comparison result signals. The NANDed signal is used as a write-in pulse along line 37a from write pointer 37. In response to each write-in pulse and when the delayed comparison result signal is the unmatching signal, write-in control 15 activates selector 14 to select the input numeral signal from terminal 10 and, at the same time, produces a tag signal "0". Thus, in the memory 36, data such as 0/3 is stored in one segment in response to the write-in pulse. Also, in response to each write-in pulse and when the delayed comparison result signal is the matching signal, write-in control 15 activates selector 14 to select the counted data signal from counter 13 and, at the same time, produces a tag signal "1". Thus, in the memory 36, data such as 1/6 is stored in memory 36 in response to the write-in pulse.

For the data expansion, the tag portion is read. When the tag signal is "0" representing the unmatching signal, the numeral signal in the data portion 3 is read and is selected by selector 17. When the tag signal is "1" representing the matching signal, the repetition number signal in data portion 3 is read and is loaded in down-counter 18. During the count down effected in down-counter 18, no data is read from the data portion in memory 36, and the compression number as stored in register 12 is selected by selector 17.

Next, a detailed operation of the output expansion section 41 is described with reference to FIG. 2c.

First, read demand unit 9 produces read-out demand pulses along line 9a. Then, in response to tag read pulses, which are slightly delayed with respect to the read-out demand pulses, the tag portion is read out along line 26. The tag signal is delayed by one cycle to produce a delayed tag signal along line 27a. The non-delayed and delayed tag signals are NANDed to produce read-out pulses along line 38a. In response to the read-out pulses, the data in the data portion 3 in memory 36 is read out to selector 17. The selector 17 selects the data from memory 36 when the non-delayed tag signal "0" (representing unmatching signal) is present, and selects the compression number data, e.g., zero from register 12 when the non-delayed tag signal "1" (representing matching signal) is present. Then, when the non-delayed tag signal is "1" (matching signal) and the delayed tag signal is "0" (unmatching signal), the down-counter 18 is loaded with the number stored in the data portion 3 of the memory 36 and starts to count down to zero in response to non-delayed tag signal "1" (matching signal). During the count down, the read-out pulse is blanked so that no data is read from the data portion 3 of memory 36. Thus, from the selector 17, the expanded numeral signal are produced serially.

As apparent from the above, a number of a high occurrence frequency should be set as the compression number in register 12. For example, zero is set since it is the number of a high occurrence frequency when a numeric calculation such as a thin matrix is calculated by a gaussian elimination method.

According to the first-in first-out memory device of the present invention, the numeral signal can be stored in a compressed manner so that the capacity of the memory 36 can be made small, resulting in cost effective of the hard ware.

Figure 2D:
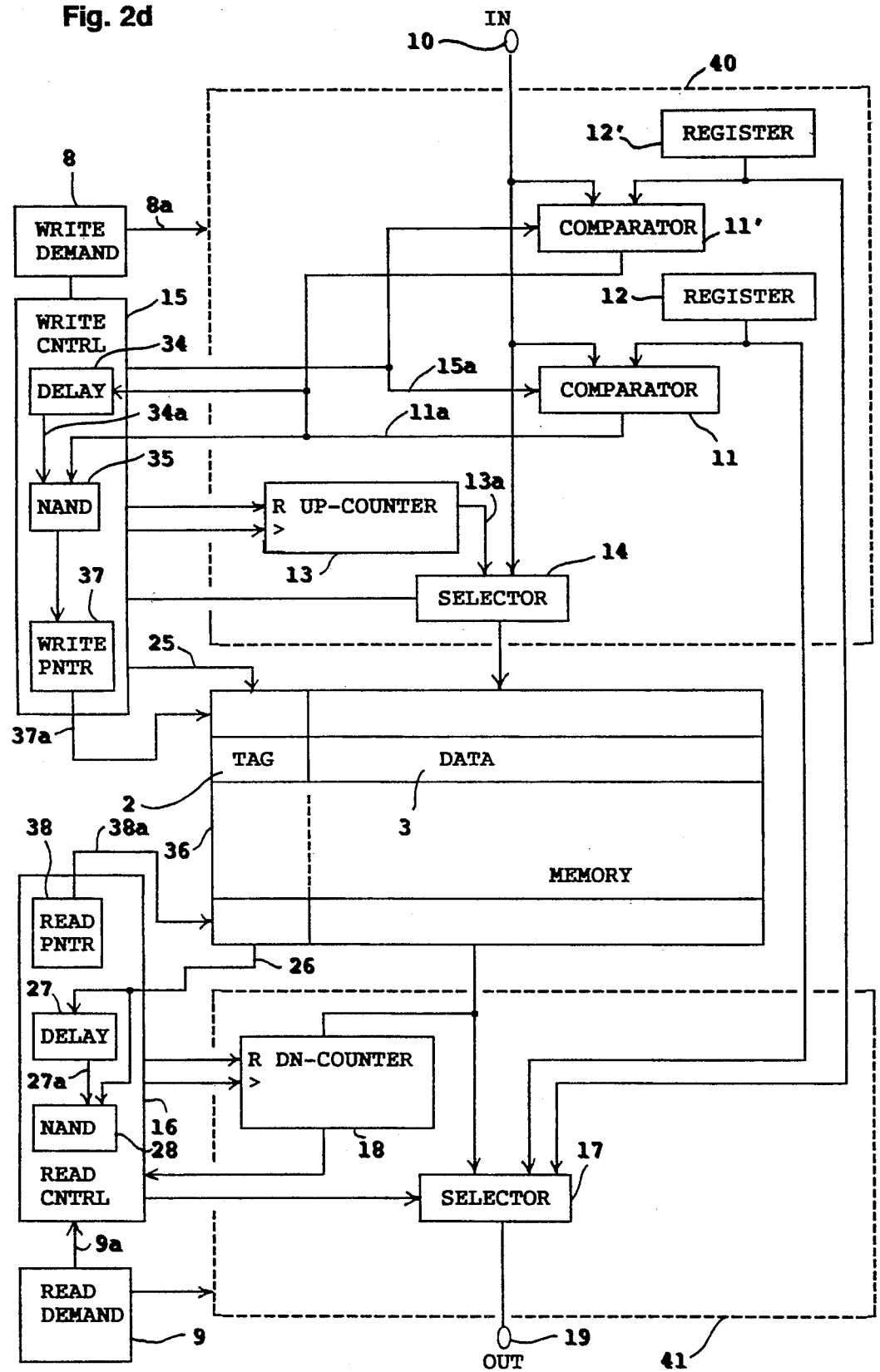
FIG. 2d is a block diagram of a first-in first-out memory device according to a second embodiment of the present invention.

Referring to FIG. 2d, a second embodiment of the first-in first-out memory device of the present invention is shown. In the first embodiment, only one numeral signal is compressed, but in the second embodiment, two different numeral signal are compressed. When compared with the device shown in FIG. 2a, the second embodiment device shown in FIG. 2d further has a register 12' and a comparator 11'. Furthermore, the tag portion 2 in memory 36 is enlarged to carry twobit data. Also, the selector 17 receives the data from both registers 12 and 12'.

Since the operation of the second embodiment is similar to that of the first embodiment, the description thereof is omitted.

Figure 3:
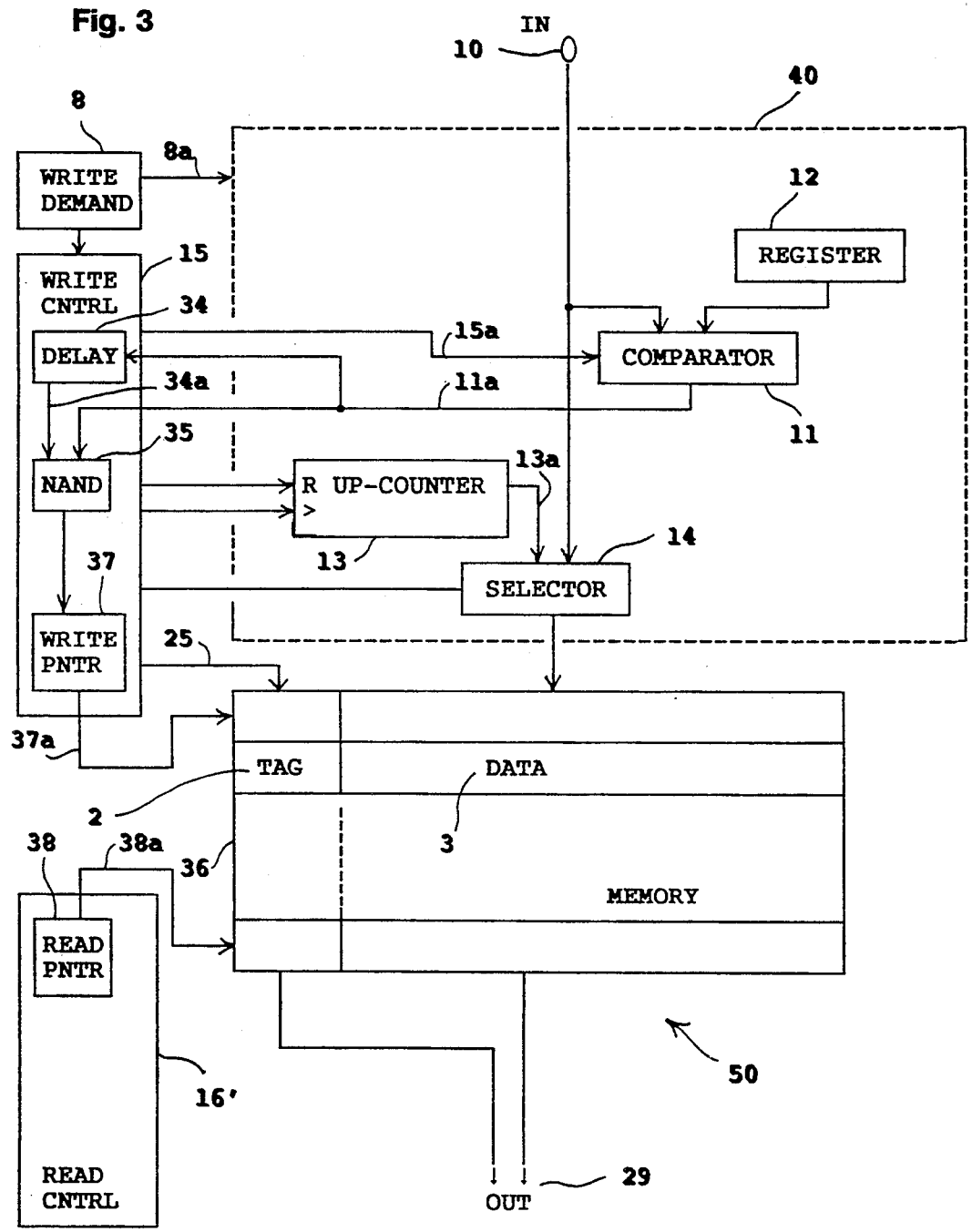
FIG. 3 is a block diagram of a encoder type first-in first-out memory device according to a third embodiment of the present invention.

Referring to FIG. 3, a block diagram of an encoder type first-in first-out memory device 50 according to the third embodiment of the present invention is shown. When compared with the device shown in FIG. 2a, the third embodiment has the same arrangement of the input compression section 40, but the output expansion section 41 is not provided. The read-out control 16' has read pointer 38 to serially read out from output 29 the data stored in memory 36 for transmission through a suitable transmission system, such as a transmission cable (not shown) FIG. 5a is a diagram of the input numeral signal and compressed output data of the encoder type device of FIG. 3.

In response to the read-out instruction, the read control circuit 16' sends the read-out pulses along line 38a so that the data in tag portion 2 and the data portion 3 indicated by the read pointer 38 are sent out. Then, the data in the memory is shifted by the read pointer 38.

When the numeral signal applied to input 10 is 3, 5, 0, 0, 0, 1, 4, 0 , 0, 2, 6 as shown in FIG. 5a, the data produced from output 29 is compressed as 0/3, 0/5, 1/3, 0/1, 0/4, ½, 0/2, 0/6 in the same manner as described above.

Figure 4:
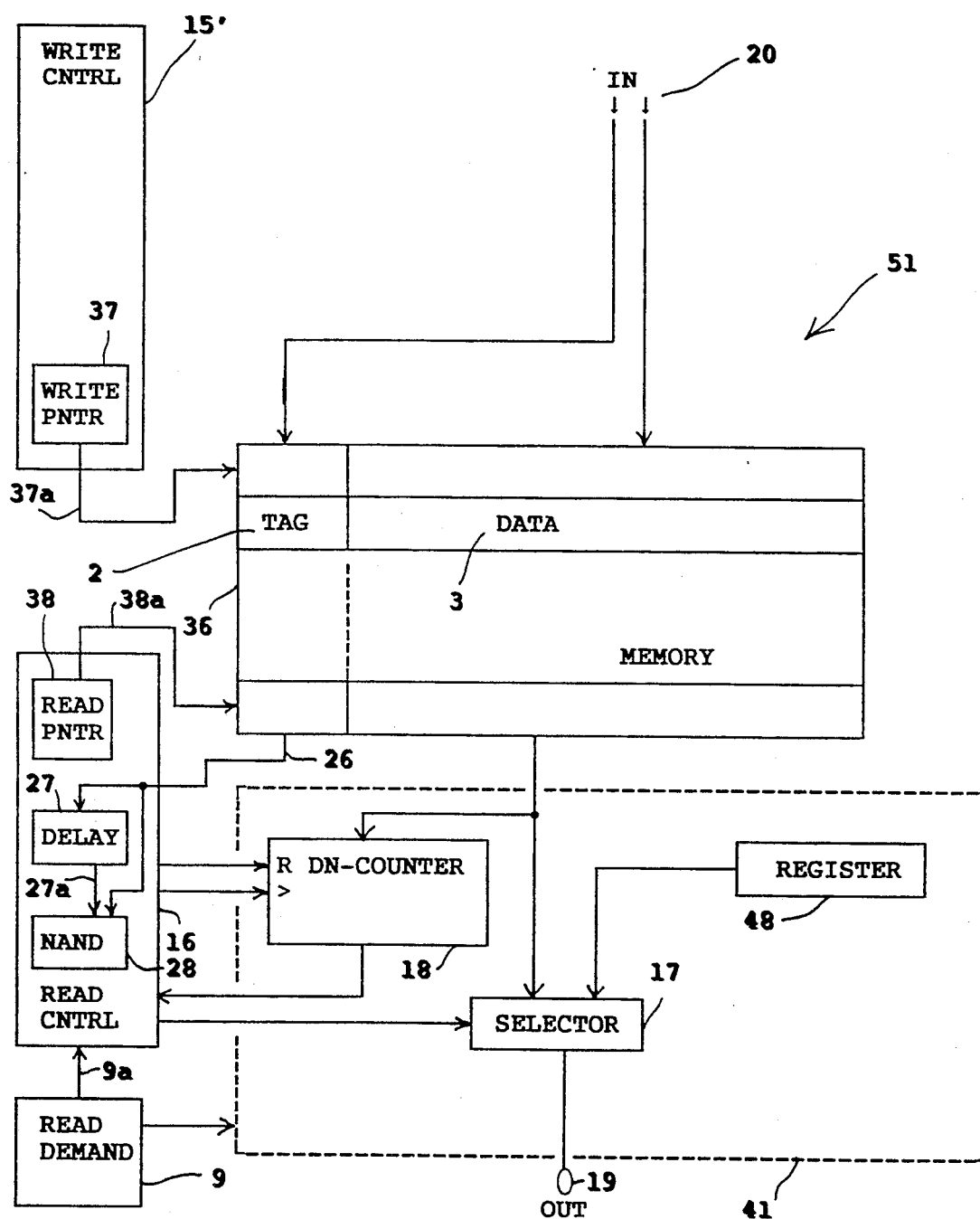
FIG. 4 is a block diagram of a decoder type first-in first-out memory device according to a fourth embodiment of the present invention.

Referring to FIG. 4, a block diagram of a decoder type first-in first-out memory device 51 according to the fourth embodiment of the present invention is shown. When compared with the device shown in FIG. 2a, the fourth embodiment has the same arrangement of the output expansion section 41, but the input compression section 40 is not provided. In the output conversion section 41 a register 48 is connected to selector 17 for storing the same compression number as that stored in register 12 in the corresponding encoder type device 50. The write-in control 15' has write pointer 37 to serially write in the compressed data applied to input 20 from a data source device, such as the encoder type device 50 shown in FIG. 3. FIG. 5b is a diagram of the input compressed data and expanded output data of the decoder type device 51 of FIG. 4.

In response to the write-in instruction, the write control circuit 15' sends a write-in pulses along line 37a so that the transmitted tag signal and compressed data signal are sequentially stored in the tag portion 2 and the data portion 3 as guided by the write pointer 37. Then, the stored data is shifted by the write pointer 37.

When the compressed data applied to input 20 is 0/3, 0/5, 1/3, 0/1, 0/4, 1/2, 0/2, 0/6 as shown in FIG. 5b, the expanded numeral signal produced from output 19 is in 3, 5, 0, 0, 0, 1, 4, 0, 0, 2, 6.

In the embodiments of FIGS. 3 and 4, it is possible to send a data indicative of the compression number, so that the compression number can be varied as desired.

It is noted that the embodiments shown in FIGS. 3 and 4 can carry out the data compression and expansion with respect to a plurality of compression numbers, such as shown in the second embodiment described above in connection with FIG. 2d.

Figures 6A, 6B, 6C:
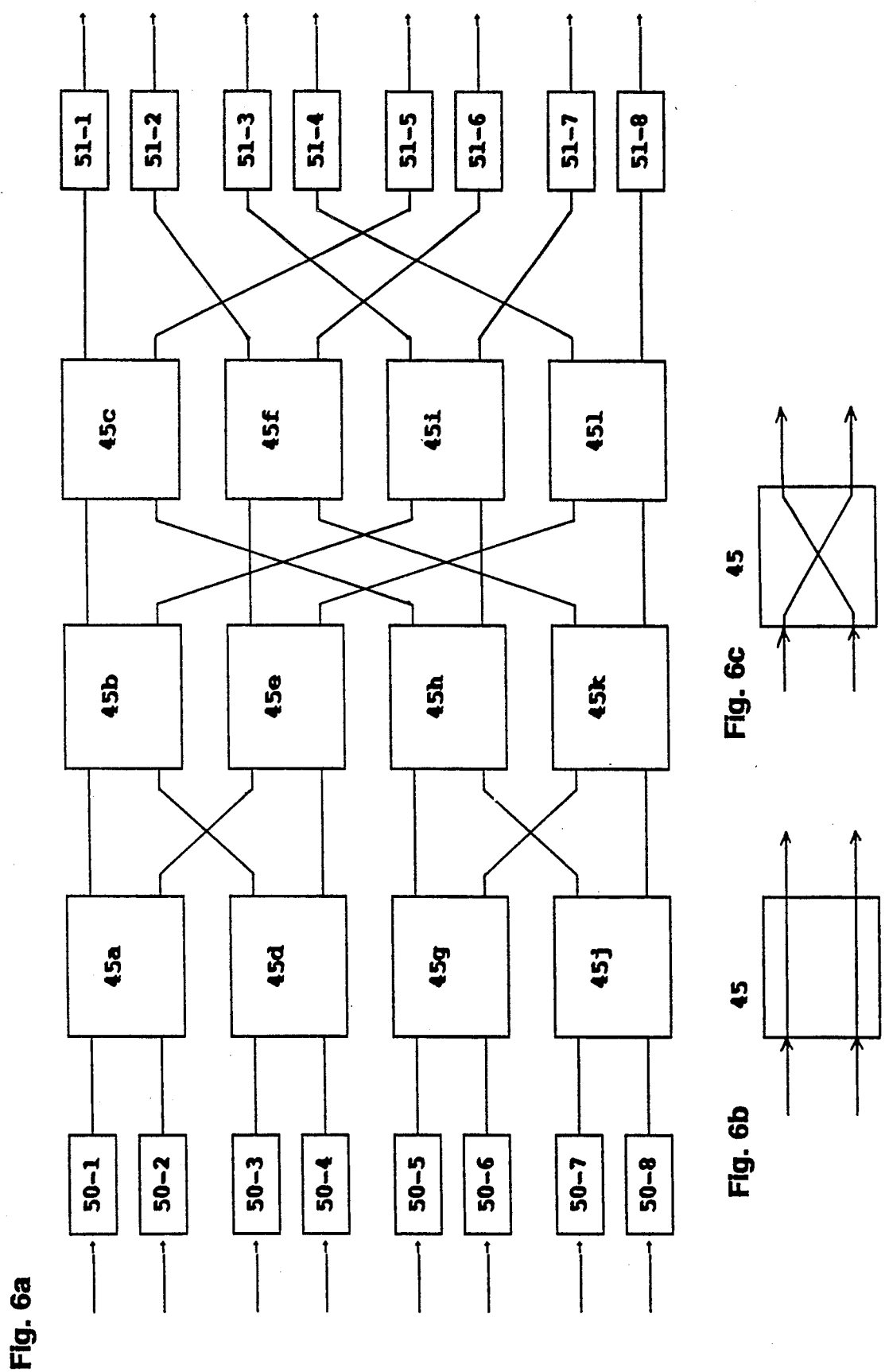
FIG. 6a-6c are block diagrams of a parallel processing system using the encoder type and decoder type first-in first-out memory devices according to the present invention.
Figure 7A:
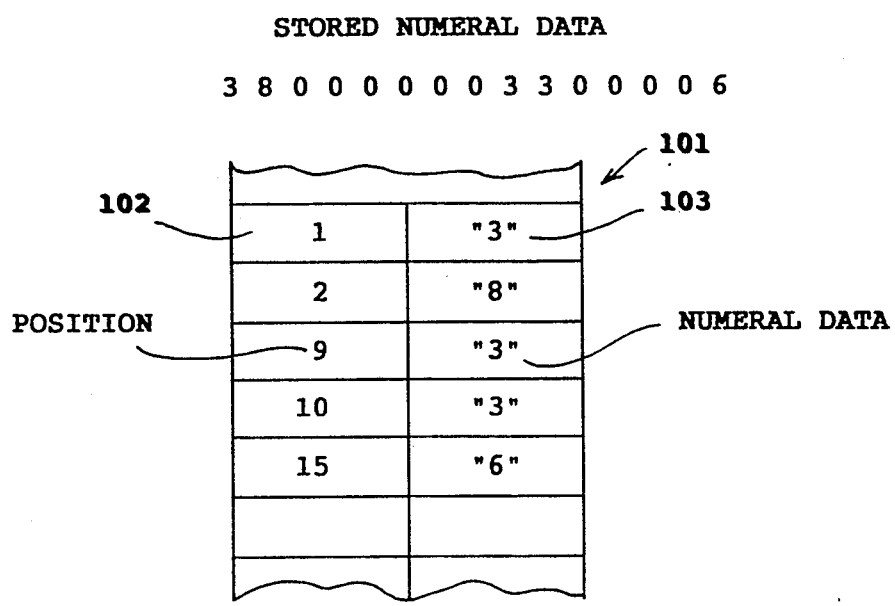
FIG. 7a is a diagram showing a data storage method according to the prior art.
Figure 7B:
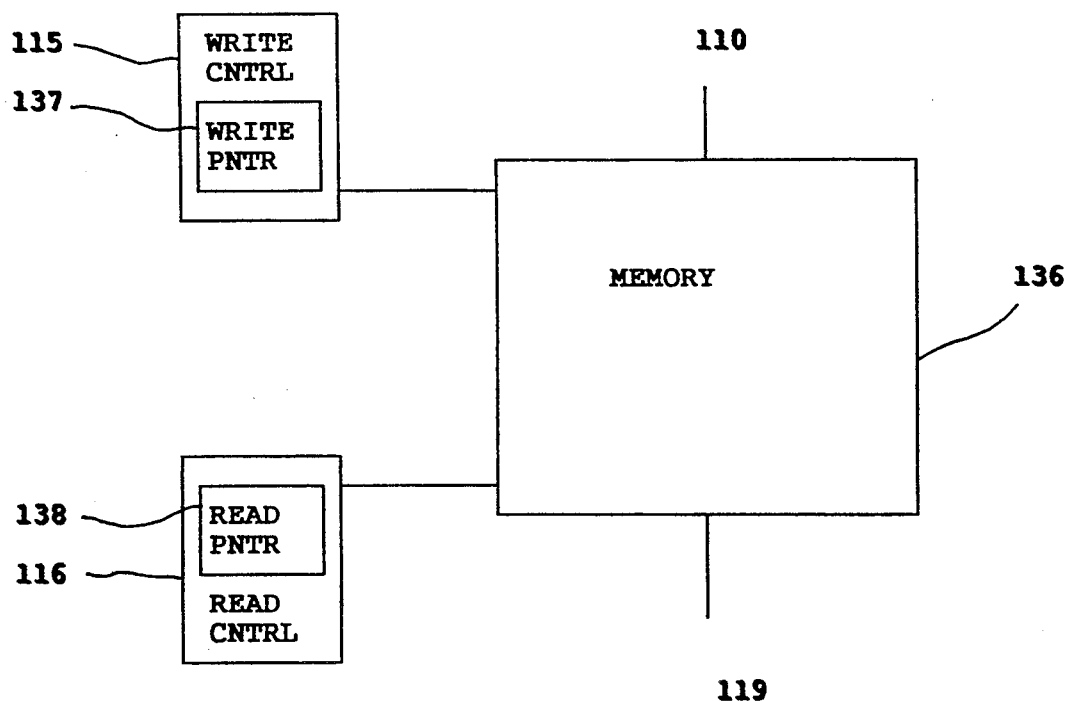
FIG. 7b is a block diagram showing a first-in first-out memory device according to the prior art.

Referring to FIG. 6a, a parallel processing system according to the present invention is shown, using the encoder type first-in first-out memory devices 50-1 through 50-8 as the input alignment and the decoder type first-in first-out memory devices 51-1 through 51-8 as the output alignment.

In the system shown in FIG. 6a, between the eight data input devices and the eight output devices, a multi-level connection network is inserted. The network is defined by twelve switches 45a through 45l connected in a high performance cubic connection, each switch 45 can be switched to either in a direct connection state as shown in FIG. 6b or in a cross connection state as shown in FIG. 6c.

For example, when a data transfer from the data input device 50-1 to data output device 51-1 is required, the compressed data from device 50-1 is transmitted straight through switches 45a, 45b and 45c, which are in direct connection state, and is expanded in output device 51-1. As another example, when the data transfer from the data input device 50-6 to the data output device 51-1 is required, the switches 45g and 45c are set in the cross connection state and the switch 45h is set in the direct connection state. Thus, the data from the input device 50-6 is transmitted through the switches 45g, 45h and 45c to the output device 51-1.

In the system shown in FIG. 6, since the first-in first-out memory devices according to the present invention are used, the amount of data transmitted through the network per unit time for sending the same amount of information per unit time is reduced greatly by the compression processing as described above. Accordingly, the probability of collisions between the transmitted data can be reduced to improve the reliability of the transmission system. Furthermore, greater amount of information can be stored in the memory.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A data storage method for storing a series of numeral signals comprising the steps of:
   storing a tag signal which discriminates between a numeral signal and a repetition number signal; and
   storing, correspondingly to said tag signal, a data signal which represents a value of a numeral signal other than a preselected numeral signal when said tag signal is representing the numeral signal, and represents a number of repetition of the preselected numeral signal when said tag signal is representing the repetition number signal.

2. A first-in first-out memory device for storing a series of numeral signals comprising:
   a comparator means for comparing between each input numeral signal and a preselected numeral signal, and for producing a matching signal when said input numeral signal is the same as said preselected numeral signal, and an unmatching signal when said input numeral signal is not the same as said preselected numeral signal;
   a first counter means for counting the number of repetition of said matching signal; and
   an encoding means for encoding said series of input numeral signals to a tag signal and a corresponding data signal such that:
   said tag signal discriminates between a numeral signal and a repetition number signal, and
   said data signal represents a value of a numeral signal other than the preselected numeral signal when said tag signal is representing the numeral signal, and represents a number of repetition of the preselected numeral signal when said tag signal is representing the repetition number signal.

3. A first-in first-out memory device as claimed in claim 2, further comprising a memory area for storing said tag signal and data signal.

4. A first-in first-out memory device as claimed in claim 3, further comprising a write pointer for indicating a writing position in said memory area.

5. A first-in first-out memory device as claimed in claim 2, wherein said data encoding means comprises a selector for selecting the input numeral signal when said unmatching signal is produced, and for selecting the counted number of matching signal when a final matching signal of a series of matching signals is produced.

6. A first-in first-out memory device as claimed in claim 2, wherein said comparator means compares between each input numeral signal and a plurality of preselected numeral signals, and for producing a matching signal when said input numeral signal is the same as any one of said preselected numeral signals, and an unmatching signal when said input numeral signal is not the same as any of said preselected numeral signals.

7. A first-in first-out memory device as claimed in claim 3, further comprising:
   a detecting means for detecting whether said tag signal is representing the numeral signal or the repetition number signal;
   a second counter means for counting a number equal to said repetition number represented by said data signal when said tag signal is detected as representing the repetition number signal; and
   a decoding means for decoding said tag signal and the corresponding data signal to said series of input numeral signals such that:
   said data signal is produced as it is when said tag signal is detected as representing the numeral signal, and
   said preselected numeral signal is produced during the counting by said second counter means when said tag signal is detected as representing the repetition number signal.

8. A first-in first-out memory device as claimed in claim 6, further comprising a read pointer for indicating a reading position in said memory area.

9. A device for reading data from a first-in first-out memory device comprising:
   a memory area for storing tag signal and data signal, said tag signal discriminates between a numeral signal and a repetition number signal, and
   said data signal represents a value of a numeral signal other than a preselected numeral signal when said tag signal is representing the numeral signal, and represents a number of repetition of the preselected numeral signal when said tag signal is representing the repetition number signal;
   a detecting means for detecting whether said tag signal is representing the numeral signal or the repetition number signal;
   a counter means for counting a number equal to said repetition number represented by said data signal when said tag signal is detected as representing the repetition number signal; and a decoding means for decoding said tag signal and the corresponding data signal to said series of input numeral signals such that:

said data signal is produced as it is when said tag signal is detected as representing the numeral signal, and said preselected numeral signal is produced during the counting by said second counter means when said tag signal is detected as representing the repetition number signal.

10. A data network comprising:

(I) a plurality of first-in first-out memory devices each for storing a series of numeral signals comprising:

a comparator means for comparing between each input numeral signal and a preselected numeral signal, and for producing a matching signal when said input numeral signal is the same as said preselected numeral signal, and an unmatching signal when said input numeral signal is not the same as said preselected numeral signal;

a first counter means for counting the number of repetition of said matching signal; and an encoding means for encoding said series of input numeral signals to a tag signal and a corresponding data signal such that:

said tag signal discriminates between a numeral signal and a repetition number signal, and said data signal represents a value of a numeral signal other than the preselected numeral signal when said tag signal is representing the numeral signal, and represents a number of repetition of the preselected numeral signal when said tag signal is representing the repetition number signal;

(II) a multilevel connection network connected to said plurality of first-in first-out memory devices;

(III) a plurality of reading devices each for reading data from one of said first-in first-out memory device through said multilevel connection network, each reading device comprising:

a memory area for storing tag signal and data signal, a detecting means for detecting whether said tag signal is representing the numeral signal or the repetition number signal;

a second counter means for counting a number equal to said repetition number represented by said data signal when said tag signal is detected as representing the repetition number signal; and a decoding means for decoding said tag signal and the corresponding data signal to said series of input numeral signals such that:

said data signal is produced as it is when said tag signal is detected as representing the numeral signal, and said preselected numeral signal is produced during the counting by said second counter means when said tag signal is detected as representing the repetition number signal.

* * * * *